United States Patent [19]

Douglas

[11] Patent Number: 5,695,569

[45] Date of Patent: Dec. 9, 1997

[54] REMOVAL OF METAL CONTAMINATION

[75] Inventor: Monte A. Douglas, Coppell, Tex.

[73] Assignee: Texas Instruments Incorporated, Dallas, Tex.

[21] Appl. No.: 192,204

[22] Filed: Feb. 4, 1994

Related U.S. Application Data

[63] Continuation of Ser. No. 890,415, May 29, 1992, abandoned, and a continuation-in-part of Ser. No. 226,237, Apr. 11, 1994, which is a continuation of Ser. No. 893,581, Jun. 2, 1992, abandoned, which is a continuation of Ser. No. 667,609, Feb. 28, 1991, abandoned.

[51] Int. Cl.$^6$ .............................. B08B 3/04; B08B 7/04
[52] U.S. Cl. ........................ 134/1.3; 134/21; 134/31; 205/656
[58] Field of Search ................ 134/1, 21, 26, 134/31, 34, 37, 1.3; 156/643, 662; 437/946; 148/DIG. 17; 205/656

[56] References Cited

U.S. PATENT DOCUMENTS

| 3,806,365 | 4/1974 | Jacob | 134/21 |
|---|---|---|---|
| 3,959,098 | 5/1976 | Schwartz | 204/129.3 |
| 4,028,135 | 6/1977 | Vig et al. | 134/1 |
| 4,132,567 | 1/1979 | Blackwood | 134/1 |
| 4,871,417 | 10/1989 | Nishizawa et al. | 134/21 X |
| 4,982,268 | 1/1991 | Schuermann | |
| 5,024,968 | 6/1991 | Engelsberg | 437/173 |
| 5,045,117 | 9/1991 | Witherell | 134/21 |
| 5,078,832 | 1/1992 | Tanata | 134/1 X |
| 5,087,374 | 2/1992 | Ding | 134/1 |
| 5,099,557 | 3/1992 | Engelsberg | 29/25.01 |
| 5,215,592 | 6/1993 | Jackson | 134/1 |

FOREIGN PATENT DOCUMENTS

| 0 286 233 A | 3/1988 | European Pat. Off. | |
| 0502356A2 | 2/1992 | European Pat. Off. | 21/306 |
| 0 567 939 A | 4/1993 | European Pat. Off. | |
| 0153982 | 1/1984 | Japan. | |
| 0077430 | 2/1985 | Japan. | |
| 850113292 | 12/1986 | Japan. | |
| 0095627 | 4/1988 | Japan. | |
| 0111337 | 4/1989 | Japan | 134/21 |
| 0226156 | 8/1989 | Japan. | |
| 880254916 | 4/1990 | Japan. | |
| 890218975 | 4/1991 | Japan. | |
| 900188702 | 3/1992 | Japan. | |

OTHER PUBLICATIONS

Douglas et al., "Photstimulated Removal of Trace Metals" *Journal of the Electrochemical Society*, vol. 9, Sep. 1991, pp. 2799–2802.

Zapka et al., "Efficient Pulsed Laser Removal of 0.2 um Sized Particles from a Solid Surface", Applied Physical Letters, vol. 58, No. 20, 20 May 1991, pp. 2217–2219.

Douglas, et al "Photostimulated Removal of Trace Metals", Journal of the Electrochemical Society, vol. 138, No. 9 Sep. 1991. pp. 2799–2802.

Douglas, et al., "Photostimulated Removal of Trace Metals", *Journal of the Electrochemical Society*, vol. 138, No. 9, Sep. 1991, pp. 2799–2802.

Zapka, et al., "Efficient Pulsed Laser Removal of 0.2 um Sized Particles From a Solid Surface", *Applied Physics Letters*, vol. 58, No. 20, 20 May 1991, pp. 2217–2219.

JP–A–63033824, *Patent Abstracts of Japan*, vol. 12, No. 244 (E–631), 9 Jul. 1988.

JP–A–4075339, *Patent Abstracts of Japan*, vol. 16, No. 291 (E–1224), 26 Jun. 1992.

JP–A–1226156, *Patent Abstracts of Japan*, vol. 13, No. 544 (E–855), 6 Dec. 1989.

*Primary Examiner*—Jill Warden
*Assistant Examiner*—Saeed Chaudhry
*Attorney, Agent, or Firm*—Dana L. Burton; James C. Kesterson; Richard L. Donaldson

[57] ABSTRACT

Generally, and in one form of the invention, a method is presented for the photo-stimulated removal of reacted metal contamination 16 from a surface 11, comprising the steps of: covering the surface with a liquid ambient 14; exciting the reacted metal contamination 16 and/or the liquid ambient 14 by photo-stimulation sufficiently to allow reaction of the reacted metal contaminantion 16 with the liquid ambient 14 to form metal products; and removing the liquid ambient 14 and the metal products from the surface 11. Other methods are also disclosed.

26 Claims, 2 Drawing Sheets

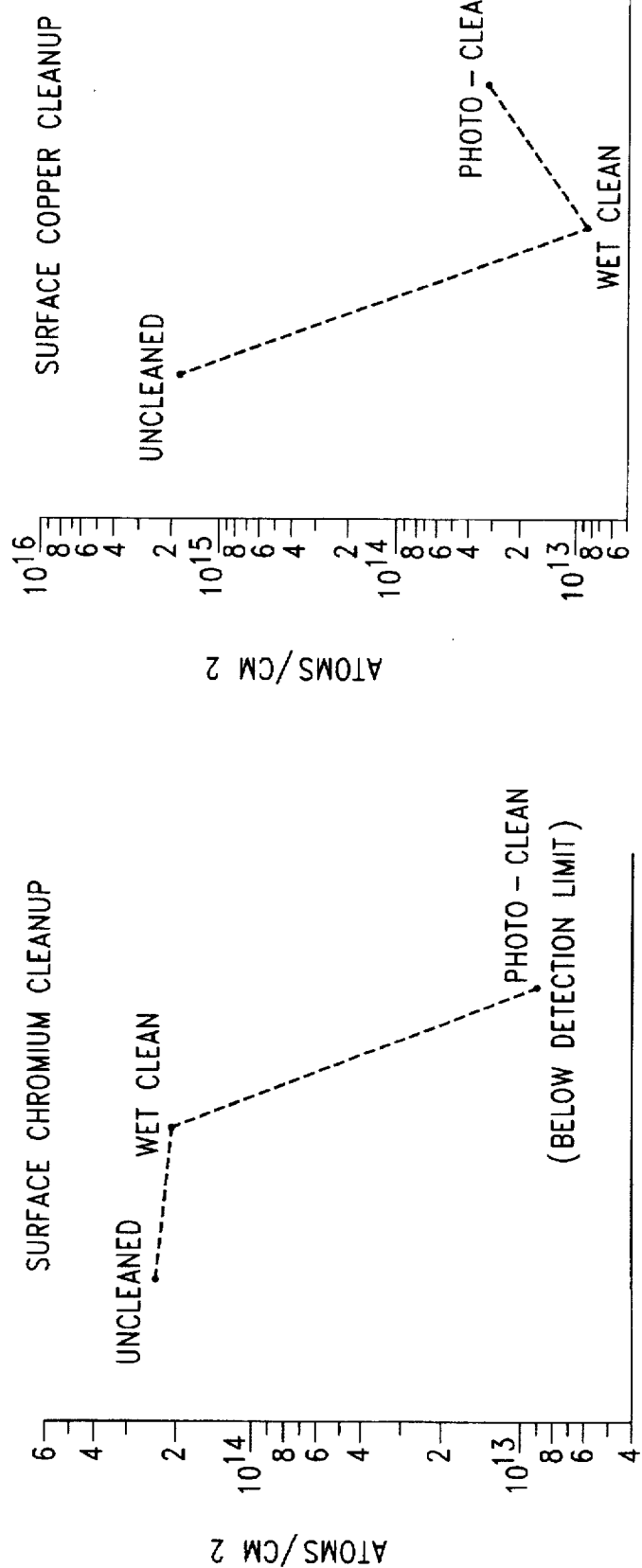
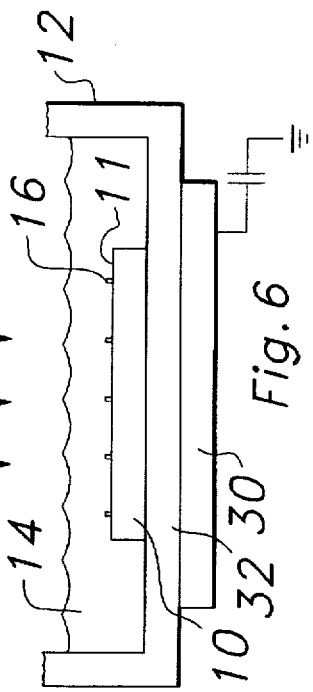

REMOVAL OF METAL CONTAMINATION

CROSS-REFERENCE TO RELATED APPLICATIONS

This application is a continuation of application Ser. No. 07/890,415, filed May 29, 1992 now abandoned, and a continuation in part of application Ser. No. 08/226,237, filed Apr. 11, 1994, still pending, which is a continuation of application Ser. No. 07/893,581, filed Jun. 2, 1992, now abandoned, which is a continuation of application Ser. No. 07/667,609, filed Feb. 28, 1991, now abandoned.

FIELD OF THE INVENTION

This invention generally relates to removal of metal contamination.

BACKGROUND OF THE INVENTION

Without limiting the scope of the invention, its background is described in connection with the removal of metals from a semiconductor substrate surface, as an example.

The crucial influence of the purity of semiconductor substrate surfaces on fabrication yield and part reliability has been appreciated by the semiconductor industry from the very outset in the 1950s. Scaling rules, which define ULSI structural and electronic requirements, imply that cleaner surfaces are requisite for acceptable ULSI device yield, performance and reliability. Not only can metal impurities in silicon form mid-band gap states that infringe on the performance of MOS transfer gates, there is concern that they degrade the integrity and reliability of thin silicon oxide films used for the storage capacitor plate and MOS transistor dielectric. As minimum feature sizing decreases and scaling rules force the use of thinner dielectric films and shallower moat region doping profiles, the sensitivity of device performance and reliability to metal impurities is expected to increase. However, wafer cleaning chemistry has remained essentially unchanged for the past 25 years, primarily relying upon hot alkaline and acidic hydrogen peroxide solutions to remove metallic, particulate and other surface contamination which undermine device yield, performance and reliability.

Heretofore, in this field, the accepted method to decrease the incorporation of metals into the bulk and near-surface silicon involves cleaning the surface of the silicon prior to the fabrication steps which are sensitive to metal impurities, such as furnace operations (which tend to diffuse the metals deeper into the silicon). Wet caustic solutions, such as hot (145° C.) nitric acid, are used to remove metals that have been deposited on the surface of the wafer during the course of previous wafer handling and processing integral to device fabrication.

However, wet chemical processing exhibits a number of problems. Firstly, depending on the electrochemical potential of the metal in a given solution relative to the solution, and the solution PH, the wet solution can actually deposit metals in the solution onto the silicon substrate. The result is that instead of removing metals from the silicon surface, metal contaminants in the solution are deposited onto the silicon surface. The sensitivity and selectivity of surface analytical methods have not been sufficient to characterize the differences in effectiveness of wet cleanup chemistries relative to various types of contamination. Resultantly, it is not clear whether the present standard wet cleanup technology is being properly implemented or whether it may actually be limiting device yield, performance and reliability, particularly in the ULSI regime. Fortunately, new analytical methods, such as Total Reflectance X-ray Fluorescence (TRXRF) spectroscopy, for example, may be able to assay surface contamination at a level of sensitivity and selectivity that can distinguish between cleanup processes, providing data meaningful enough to relate them to device performance.

Secondly, the temperature of the wet solution is of grave concern, since the diffusion of metals into bulk silicon increases at higher temperatures. Some metals, such as Au and Cu, rapidly diffuse into silicon at room temperature. Hence, elevating the temperature of the metal removal solution probably only serves to drive surface metal contaminants into the bulk silicon, instead of removing them from the surface by altering the metals' oxidation state and putting them into solution.

Thirdly, even high-purity source chemicals exhibit unacceptable levels of contamination from particulates, chemical plating of metals and other sources of contamination. It is both very difficult and very expensive to remove particles and contaminants from the caustic solutions used to remove metals from a silicon/silicon oxide/etc. substrate. The caustic solution can also react with its environment, placing even more particles and contaminants into the solution. Hence, the caustic solution used to remove metals can actually introduce particles and contaminants onto the wafer that is subject to "cleaning".

Fourthly, the cost of producing high-purity, electronic-grade, caustic chemicals is extremely high. Moreover, it is not clear whether improvements in caustic chemical purity can track increasingly demanding ULSI fabrication requirements, particularly in view of the degradation of, and the contamination from, the particle and chemical filtration devices themselves, when exposed to these extremely reactive chemicals.

Fifthly, each of the solutions used to remove metals from a silicon wafer exhibit different removal efficiencies with respect to various metals. That is, one particular solution may efficiently remove one metal yet at the same time be nearly ineffectual with respect to removing a second metal. The solution constituents, their relative concentrations and the sequence in which the solutions are used strongly influence the effectiveness of the cleanup toward particular contaminants. Because it is difficult to tailor one general cleanup process to accommodate even most of the reasonable sources of contamination, most practitioners suggest that a series of caustic solutions is necessary to achieve acceptable cleanup of all metals of concern.

Finally, the great expense associated with the purchase of these caustic cleanup chemicals is dwarfed by the greater expense of disposing of the used solutions. Very restrictive environmental regulations must be adhered to, and the environmental concerns and costs surrounding hazardous chemical disposal will likely increase in the future.

To address the above problems, dry cleanup processing has been proposed to remove surface metallic impurities. However, these methods use caustic, hazardous source gases which are difficult to clean. Additionally, these gases can react with the equipment used to transport the gases, producing particulate and chemical contamination on the very substrate to be cleaned. These so-called dry cleanup methods usually involve halogen radical generation and reaction with the metal to form a volatile metal halide product. Metals that do not form volatile metal halides are partially removed by the so-called "lift-off" method, which involves removal of the metal by etching the underlying silicon with the halogen radicals. The nonvolatile metal halide is removed, in part, by flowing with the volatile silicon halide mass stream. However, the silicon is etched by all of these methods, producing an unacceptably rough silicon surface. Recent studies have demonstrated that current embodiments of these dry cleanup methods also degrade device performance compared to their wet acid cleanup counterpart.

Therefore, there is a strong interest in the semiconductor industry in developing an alternative substrate surface cleanup technology that can overcome some or all of these deficiencies.

SUMMARY OF THE INVENTION

It is herein recognized that a need exists for a method for the removal of metal contamination from a surface without the use of caustic chemicals. Specifically, it is desired that the cleanup method use ultra-pure source chemicals that are economical and non-hazardous, that it is effective for a broad spectrum of contaminants, that its implementation is not confounded by a large process parameter domain, and that it involve processing that satisfies the purity requirements posed by ULSI technology. The present invention is directed towards meeting those needs.

Generally, and in one form of the invention, a method is presented for the photo-stimulated removal of reacted metal contamination from a surface, comprising the steps of: covering the surface with a liquid ambient; exciting the reacted metal contamination and/or the liquid ambient by photo-stimulation sufficiently to allow reaction of the reacted metal contamination with the liquid ambient to form metal products; and removing the liquid ambient and the metal products from the surface.

In another form of the invention, a method is presented for the photo-stimulated removal of reacted metal contamination from a surface of a semiconductor, comprising the steps of: placing the semiconductor into a vacuum environment; lowering a temperature of the semiconductor surface to the dew point; introducing a vapor phase liquid ambient into the vacuum environment; exciting the reacted metal contamination and/or any condensed liquid ambient by photo-stimulation sufficiently to allow reaction of the reacted metal contamination with the liquid ambient to form metal products; and returning the environment to a vacuum.

In yet another form of the invention a method is presented for the removal of metal contamination from a first surface, comprising the steps of: covering the first surface with a liquid ambient; applying a bias to a second surface opposite the first surface to create a layer of charge on the first surface to allow reaction of the metal contamination with the liquid ambient to form metal products; and removing the liquid ambient and the metal products from the surface. Additionally, the step of exciting the metal contamination and/or the liquid ambient by photo-stimulation may be performed in this method.

An advantage of the invention is that it allows for the removal of metal contamination from a surface without the use of caustic chemicals.

BRIEF DESCRIPTION OF THE DRAWINGS

The foregoing and further aspects of the invention are illustrated in the accompanying drawings wherein like elements are denoted by like reference designators and in which:

FIG. 3 is a logarithmic plot showing surface Cr contamination of a control sample, a sample cleaned with wet acid cleanup and a sample cleaned with the photo-stimulated cleanup method;

FIG. 4 is a logarithmic plot showing surface Cu contamination of a control sample, a sample cleaned with wet acid cleanup and a sample cleaned with the photo-stimulated cleanup method;

FIG. 6 is a cross sectional diagram of a suitable apparatus setup for implementing a third preferred embodiment method.

DETAILED DESCRIPTION OF PREFERRED EMBODIMENTS

Figure 1:
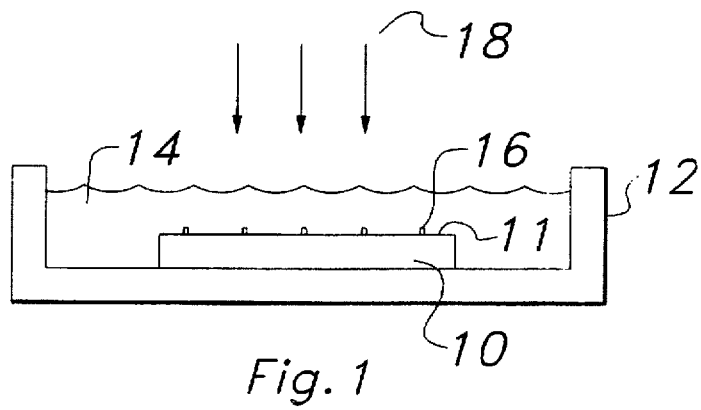
FIG. 1 is a cross sectional diagram of a suitable apparatus setup for implementing a first preferred embodiment method.

Table A lists the steps of a first preferred embodiment method for the photo-illuminated removal of metals from a semiconductor substrate (as an example). FIG. 1 illustrates a suitable apparatus setup to implement the method of Table A. Operations commence with step A1 in which the substrate 10 to be cleaned is placed into a receptacle 12. Then, in step A2, the substrate 10 is immersed in a liquid ambient 14, preferably ultrapure water such as deionized water at, for example, 25° C. such that the upper surface 11 of substrate 10 is completely covered. This places the liquid ambient 14 in physical contact with any metal contamination 16 on the semiconductor surface 11. Next, in step A3, the substrate 10/liquid ambient 14 combination is preferably irradiated with, for example, visible, ultraviolet and/or infrared light 18 from, for example, a 200 Watt, high pressure, Hg/Xe arc lamp for five minutes. The wavelength of the light used may be in the range of approximately 170–1500 nm. Preferably, the liquid ambient 14 is then drained from the substrate 10, in step A4, which is then rinsed, preferably with ultrapure water such as deionized water, for five seconds, in step A5. Finally, in step A6, the substrate 10 is preferably dried with nitrogen gas and is ready for further wafer processing. This method has proven useful for both elemental metals and reacted metals.

TABLE A

| | |
|---|---|
| A1 | Place substrate into receptacle |
| A2 | Immerse substrate in liquid ambient |
| A3 | Irradiate substrate/liquid ambient |
| A4 | Drain liquid ambient |
| A5 | Rinse substrate |
| A6 | Dry substrate |

The first preferred embodiment of the present invention may optionally be modified in several ways. For example, the liquid ambient 14 may be ultrasonically or megasonically agitated to provide a mechanical aid to the removal of the reaction products from the substrate surface 11. Also, rather than immersing the wafer 10 into a stagnant liquid ambient 14 reservoir, it may be placed into a flowing or spraying atmosphere. The moving liquid would ensure that solubility limits (which would limit removal by dissolution into the liquid ambient) would not be achieved.

Preliminary analysis of silicon surfaces treated with the process of the first preferred embodiment show a fourfold increase of silicon oxide ($SiO_x$) at the surface after treatment (the analysis technique employed is sensitive to a depth of approximately 40 Angstroms). This provides a significant added benefit in that the surface is effectively "sealed" after metal removal to protect it from further contamination before the next processing step can be performed.

Although the chemistry of photo-stimulated removal of trace metals in their elemental state is not completely understood at the present time, it is believed that a possible mechanism for the reaction may involve electronic excitation of a ground-state, metal-water adduct precursor. The metal-water adduct precursor that is excited may be the metal 16 atom itself, or the ambient species (e.g. a water 14 molecule in the first preferred embodiment), or a complex that is formed between the two entities. The excitation may be electronic excitation, vibrational excitation, dissociative excitation, etc., for example. The lifetime of the excitation is sufficient to allow reaction of the metal-water adduct to a metal product to proceed along an excited state reaction coordinate that is not encumbered by energy barriers that undermine reaction along the ground-state potential energy (PE) surface. Both the metal and the ambient species may need to be excited at the same time. The resultant product, which contains the contaminating metal, may then be removed from the surface of the wafer 10 along with the ambient species, or the product may diffuse into the ambient species and therefore be removed when the ambient species is removed. Whatever the mechanism may be, trace metal contamination on a surface can be removed.

Molecular-scale, metal atom/water and metal cluster/water ground state and photo-induced reactions have been examined by Margrave and co-workers for a broad spectrum of metals, isolated in cryogenic noble gas matrices, using IR, ESR and UV/VIS spectroscopies (see Journal of Physical Chemistry, 89, pp.3547–3552 (1985), High Temperature Science, 25, pp.1–15 (1988), High Temperature Science, 18, pp. 97–118 (1984), High Temperature Science, 17, pp.201–235 (1984), Journal of the Chemical Society, Faraday Transactions I, 79, pp.1533–1553 (1983) and High Temperature Science, 13, p.338 (1980)). Initial formation of a metal-water adduct was observed in most instances. It is believed that the metal coordinates with water's $3a_1$ MO (comprised mostly of the in-plane oxygen atom p-orbital which symmetrically splits the hydrogen atoms) to form an adduct. The adduct is described by $C_{2v}$ symmetry, with the metal atom lying in the plane of the water molecule and bonding through the oxygen atom. Adduct formation is evidenced by a decrease in the $v_2$ vibrational mode associated with charge transfer of electron density from the $3a_1$ water orbital to the metal atom. By annealing or photolysis of the rare gas matrix, the metal-water adduct formed H-(metal atom)-OH (HMOH) which frequently exhibited further reaction to form the metal hydroxide or the metal oxide. These studies were performed on metal and water species isolated in an inert cryogenic crystalline argon matrix and did not investigate the practical problem of a metal atom attracted to a semiconductor surface and interacting with liquid or vapor phase water.

The applicant has rationalized spontaneous versus photo-initiated metal-water reactivity, using orbital-to-orbital and state-to-state correlation diagrams. These studies have revealed the absence of a ground state activation barrier for metals, such as aluminum, that spontaneously formed HMOH. In contrast, activation energy barriers in the ground state PE surfaces, but not in certain excited-state PE surfaces, have been calculated for metal-water moieties that required photolysis to form the metal insertion product.

However, the nature of the interaction between the electronically excited metal atom/cluster-water species is not understood. Insight into this interaction will help to rationalize the mechanism that generates the metal insertion product, HMOH, and, ultimately, the metal hydroxide and metal oxide daughter products.

On the surface of a silicon substrate 10, the surface trace metal is most likely highly clustered compared to the matrix environment, and the metal-silicon surface interaction is much stronger compared to interaction with the noble gas matrix. Excited-state reaction dynamics studies suggest that the metal-water interaction may possibly be described by frontier orbital considerations. However, these studies do not account for strong electrostatic interactions. That is, the metal atom/cluster may be converted to a hard Lewis acid by photo-stimulation to an excited state. Water is a hard Lewis base, so the magnitude of the Coulombic term in the excited metal-water interaction depends upon the exact nature of Lewis acid generated by photoexcitation. In turn, this depends upon the metal and the characteristics of the electronic excitation. The reaction sequence from the reactive, excited state complex is not known for the surface metal-water entity. It is not unreasonable to adopt the reaction pathway, forming an insertion product which is unstable with respect to metal hydroxide and/or metal oxide. In any case, further work needs to be done in order to fully understand the reaction sequence for the surface metal-water chemistry. This lack of understanding of the exact nature of the chemical process does not, however, preclude the use of this phenomenon for the photo-stimulated removal of trace metals as, for example, described above in relation to the first preferred embodiment method.

Figure 2:
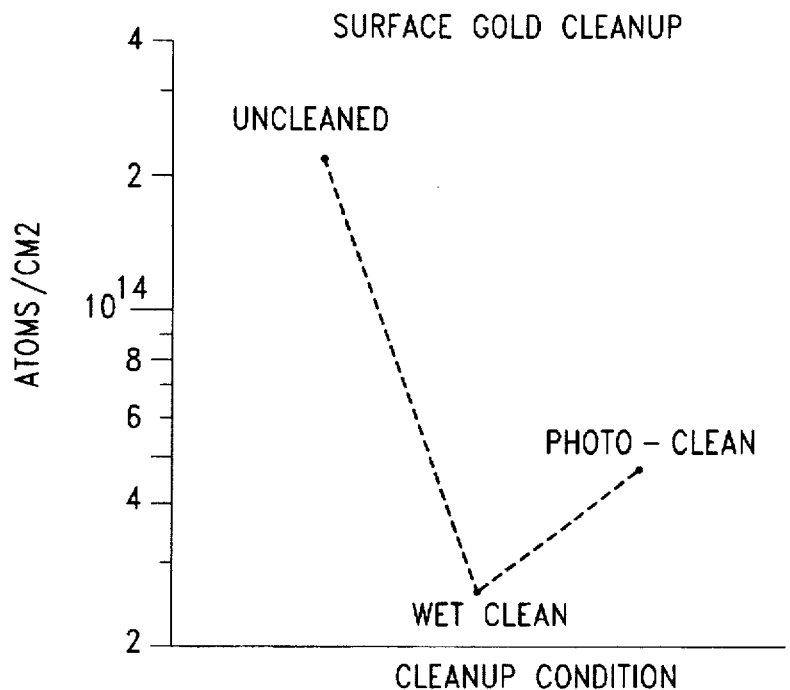
FIG. 2 is a logarithmic plot showing surface Au contamination of a control sample, a sample cleaned with wet acid cleanup and a sample cleaned with the photo-stimulated cleanup method.

FIGS. 2, 3 and 4 illustrate preliminary results of the amount of elemental trace metal removal, comparing the standard wet acid cleanup schedules of Table B to the first preferred embodiment photo-stimulation cleanup method of Table A for Au, Cr and Cu, respectively. Each figure also illustrates the initial level of intentional metal contamination. Because of the large magnitude of metal removal for both wet and photo-stimulation removal methods, the metal surface concentration is plotted on a logarithmic scale. Gold, chromium and copper were evaporated onto individual, 100 mm, 15 Ohm-cm, n-type, (100) silicon wafer substrate surfaces by resistive heating. Three samples were prepared from each metal-deposited wafer. The first sample was not cleaned and served as a control to determine the level of trace metal surface contamination. The second sample was cleaned in a 200 ml bath containing standard acid cleanup solutions. Table B details the wet acid chemistry used to remove the intentional trace contamination for each metal. After the acid clean, the samples were rinsed with deionized water for five minutes and dried with nitrogen. The third sample was cleaned with the schedule of the first preferred embodiment, as illustrated in Table A. The surface metal concentration of each sample was measured by instrumental neutron activation analysis (INAA). Quantization of neutron flux was established by metal monitor samples. The above metals undergo neutron capture to produce radioactive products, whose decay can be monitored by gamma-ray spectroscopy. INAA of silicon wafers can exhibit surface sensitivity in the $1 \times 10^{11}$ atoms/$cm^2$ regime. Several counts were conducted at calculated time intervals to allow higher sensitivity to isotopes with longer half-lives.

TABLE B

| METAL | CLEANUP CHEMISTRY | RATIO | TEMP | TIME |
|---|---|---|---|---|
| Au | HCl(12N):$H_2O_2$(30%):$H_2O$ | 5:1:4 | 35° C. | 5 MIN |
| Cr | $H_2SO_4$(17.8M):$H_2O_2$(30%) | 6:4 | 75° C. | 5 MIN |
| Cu | $H_2SO_4$(17.8M):$H_2O_2$(30%) | 6:4 | 75° C. | 5 MIN |

FIG. 2 shows that the wet acid cleanup of Table B removed slightly more surface Au than the photo-stimulated cleanup of Table A. However, both cleanup methods removed smaller amounts of the trace surface Au contamination than one might expect. The acid clean removed approximately 88 percent, and the photo-stimulated clean removed approximately 78 percent of the Au. The poor removal on the part of both methods may be related to gold's high diffusion coefficient into single crystal silicon at room temperature. Diffusion effects may be particularly pronounced, considering the method of intentional contamination by resistive heat evaporation. Nonetheless, maintaining the wafer substrate 10 temperature as low as possible during the cleanup process is an important consideration that can be implemented by the photo-stimulated clean technique without influencing removal efficiency. In contrast, some of the wet acid cleanup chemistries require elevated temperatures to activate metal removal. This can lead to surface metal "removal" by diffusion of the metal into the bulk. In turn, this can result in misleading removal figures while degrading actual device performance, reliability and yield, compared to processing that removes contamination 16 from the wafer 10 instead of diffusing contamination 16 into the wafer 10.

FIG. 3 shows that the photo-stimulated cleanup of Table A not only removed a larger absolute amount of surface chromium contamination compared with the Au removal of FIG. 2, but also removed significantly more Cr than did the wet acid cleanup of Table B. The photo-stimulated cleanup removed surface Cr contamination to below the limits of detection by INAA. The minimum percent removal, therefore (based on the detection limit of the INAA) is at least 96 percent, in contrast with the approximately 13 percent Cr removal using the wet acid cleanup. This is a significant result due to the fact that there are many sources of Cr contamination in a wafer fabrication facility and its associated processing equipment.

FIG. 4 indicates that both the photo-stimulated cleanup of Table A and the wet acid cleanup of Table B removed a larger percent of the Cu surface contamination than was removed for Au or Cr. The wet acid cleanup removed slightly more Cu (approximately 99.5 percent) compared to the photo-stimulated cleanup (approximately 98.5 percent), however the difference between the two results is not statistically significant.

It is important to note that all of the experimental results presented herein are partially plagued by INAA's inability to discern between surface and bulk contamination; however, it is believed that it is better to assay all potential origins of metal contamination and to use a wet acid cleanup control sample to compare with the photo-stimulated cleanup results. As a result of bulk contamination and diffusion effects, the absolute amount of "surface" metal removal could be higher than indicated by the above results.

The chemistry of photo-stimulated removal of reacted trace metals, such as oxidized metals, is even less understood at the present time than the removal of elemental trace metals. However, experimental results have shown the method of the present invention to be an effective means of removing reacted trace metals. Table C shows experimental results, using the process of Table A, examining removal of reacted metals, in this case oxidized copper, iron, tungsten, zinc, nickel and lead, from a silicon surface. It has also been shown experimentally that reacted metals can be removed from surfaces besides silicon, in this case, Cu from $SiO_2$.

TABLE C

| REACTED METAL | METAL CONCENTRATION BEFORE PHOTOCLEAN (ATOMS/$CM^2$) | METAL CONCENTRATION AFTER PHOTOCLEAN (ATOMS/$CM^2$) |
|---|---|---|
| Fe | 1.3E15 | * <3.5E13 |
| W | 5.2E14 | * <2.4E13 |
| Ni | 1.2E15 | * <1.8E13 |
| Pb | 2.7E14 | * <1.8E12 |
| Cu ($SiO_2$) | 9.6E14 | * <1.6E13 |
| Cu (Si) | 9.6E13 | * <1.8E13 |

* Denotes below detection limit of RBS (Rutherford Backscattering)

Figure 5:
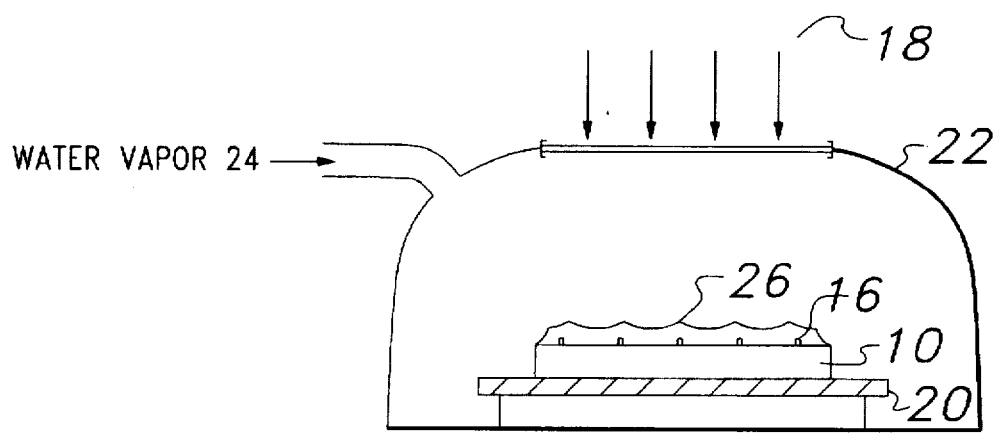
FIG. 5 is a cross sectional diagram of a suitable apparatus setup for implementing a second preferred embodiment method.

Table D lists the steps of a second preferred embodiment of the present invention which is realized by forming a thin layer of liquid, preferably water on the contaminated semiconductor surface by vapor phase condensation. FIG. 5 illustrates a suitable apparatus setup to implement the method of Table D. The method commences with step D1 in which the substrate 10 (containing metal contaminants 16) is placed onto a temperature controlled chuck 20. Then, in step D2, the substrate 10/chuck 20 is placed into a vacuum chamber 22 which is then evacuated in step D3. In step D4, the temperature of the chuck 20 (and hence the substrate 10) is lowered to the dew point. Next, in step D5, a vapor phase liquid ambient, preferably water vapor 24, is introduced into the chamber 22. After a period of time, a thin layer of condensed water 26 will form preferentially on the substrate 10 surface due to its temperature being at or below the dew point. Then, in step D6, the substrate 10/water 26 is preferably irradiated with visible, ultraviolet and/or infrared light 18 from, for example, a 200 Watt, high pressure, Hg/Xe arc lamp for five minutes. Finally, in step D7, the chamber 22 is evacuated, removing all of the water vapor 24, condensed water 26 and metal contaminants 16. Optionally, the substrate 10 can be rinsed with ultrapure water, such as deionized water, for five seconds, for example, and then dried with nitrogen gas.

TABLE D

| | |
|---|---|
| D1 | Place substrate onto temperature controlled chuck |
| D2 | Place substrate/chuck into vacuum chamber |
| D3 | Evacuate chamber |
| D4 | Lower temperature of substrate/chuck to dew point |
| D5 | Introduce water vapor into chamber |
| D6 | Irradiate substrate/condensed water with visible/ultraviolet light |
| D7 | Evacuate chamber |

The second preferred embodiment method of Table D may be modified in several ways. For example, instead of using a light source to excite the metal contaminants and/or ambient species, other energy sources such as electron flux, electromagnetic field sources (e.g. RF, microwave, etc.), or energetic ion energy prepared and delivered to the surface by various plasma techniques (e.g. electron cyclotron reactors (ECR), etc) or broad area sources of electrons or ions under high vacuum, for example. After water has condensed onto the surface, the surface may be heated above the dew point to remove all water molecules except those that have already formed adducts with the metal atoms (this will provide for more efficient exposure of the adducts to photo-stimulation). Also, the vapor phase or liquid phase ambient species may be acidic or alkaline (e.g. HCl) or one of the standard wet acid cleanup solutions (e.g. SC-2 ($HCl/H_2O_2/H_2O$)). It will be appreciated that most cleanup scenarios would benefit from an excitation of the metal contaminant and/or ambient species as described in the foregoing. This embodiment is also applicable to both elemental and reacted trace metals.

In a third preferred embodiment, as shown in FIG. 6, the substrate 10 to be cleaned may be placed in a receptacle 12 and a plate 30 may be placed below the substrate 10. The substrate 10 and the plate 30 are preferably separated by a nonconductive membrane 32, such as a thin layer of teflon. The membrane 32 may be the bottom of the receptacle 12 (as shown) or may be a separate unit. The substrate is immersed in a liquid ambient 14, preferably ultrapure water such as deionized water. The plate 30 is then biased to create a charge on the plate 30, resulting in an accumulation layer of charge on the surface 11 of the substrate 12. This creates an acidic (e.g., $H^+$) or an alkaline environment (e.g., $OH^-$), depending on the polarity of the acumulation layer of charge, at the surface 11 of the substrate 12. This allows for metal contamination 16 at the surface 11 of the substrate 10, which is not soluble in a neutral ambient 14 but is soluble in an acidic or an alkaline environment, to be removed. The process may be continued as in steps A4 to A6, shown in Table A, if desired. This embodiment provides the advantages of creating a very caustic environment at the surface 11 of the substrate 10, thereby increasing solubility of certain metals such as Au, without having to deal with caustic substances and the ability to "turn off" the caustic environment by removing the bias. As an example, a 100 volt bias can change the pH of an ambient 14 such as water from approximately 7 to 11 (depending on the thickness of the membrane 32 and the substrate 10). The accumulation layer on the surface 11 of the substrate 10 is probably on the order of 2–3 microns thick. Optionally, photo-stimulation may be added to this process by irradiating with energy 18.

The third preferred embodiment may optionally be combined with the first preferred embodiment described above to enhance the removal of metal contamination (both reacted and elemental metals) in a neutral ambient by photo-stimulation. The combination of embodiments also allows for removal of metal contamination which is not easily removed in a neutral ambient by photo-stimulation. The removal of metal contamination in a acidic or alkaline environment may also be enhanced by the addition of photo-stimulation.

A few preferred embodiments have been described in detail hereinabove. It is to be understood that the scope of the invention also comprehends embodiments different from those described, yet within the scope of the claims. For example, the liquid ambient used, while preferably water, could be other polar and nonpolar liquids, such as alcohols, acetone, ammonia and alkanes. Similarly, this photo-stimulation process could be used to enhance existing methods of removal in acidic and alkaline environments. Words of inclusion are to be interpreted as nonexhaustive in considering the scope of the invention.

The terms photo-stimulated, photo-illumination, photo-initiated, photoexcitation, etc. are used herein for convenience of description, however the term "photo" may be replaced with "radiant energy" or "energetic ion energy" throughout the specification and the appended claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for the removal of metal contamination from a first surface of a semiconductor comprising the steps of:
   a. covering said first surface of said semiconductor with a liquid ambient;
   b. applying a bias to a second surface of said semiconductor wherein said bias is provided by a source external to said liquid ambient, said second surface being opposite said first surface to create a layer of charge on said first surface to allow reaction of said metal contamination with said liquid ambient to form metal products; and
   c. removing said liquid ambient and said metal products from said first surface.

2. The method of claim 1 further comprising the step of exciting said metal contamination and/or said liquid ambient by photo-stimulation.

3. The method of claim 2 wherein said excitation is provided by a Hg/Xe arc lamp.

4. The method of claim 1 wherein said covering step comprises condensing a vapor phase ambient species on said first surface.

5. The method of claim 1 further comprising causing said deionized water to flow over said first surface.

6. The method of claim 1 further comprising agitating said deionized water.

7. The method of claim 1 further comprising the step of drying said first surface with nitrogen gas.

8. The method of claim 1 further comprising the step of rinsing said first surface with water.

9. The method of claim 1, wherein said liquid ambient is water.

10. A method for the photo-stimulated removal of metal contamination from a semiconductor surface, comprising the steps of:
    covering said semiconductor surface with a liquid ambient;
    irradiating said semiconductor surface and said liquid ambient with ultraviolet light; and
    removing said liquid ambient from said semiconductor surface.

11. The method of claim 10 further comprising the step of drying said semiconductor surface with nitrogen gas.

12. The method of claim 10 further comprising the step of rinsing said semiconductor surface with water.

13. The method of claim 12 further comprising the step of drying said semiconductor surface with nitrogen gas.

14. The method of claim 10 further comprising causing said liquid ambient to flow over said surface.

15. The method of claim 10 further comprising agitating said liquid ambient.

16. The method of claim 10 wherein said irradiating step is provided by a Hg/Xe arc lamp.

17. The method of claim 10, wherein said metal contamination comprises trace metal.

18. The method of claim 10, wherein said metal contamination comprises reacted metal.

19. The method of claim 10 wherein said liquid ambient is deionized water.

20. A method for the photo-stimulated removal of metal contamination from a surface of a semiconductor, comprising the steps of:

placing said semiconductor into a vacuum environment;

lowering a temperature of said semiconductor surface to the dew point;

introducing a water vapor into said vacuum environment;

irradiating said semiconductor surface and any condensed water with visible and/or ultraviolet light; and returning said environment to a vacuum.

21. The method of claim 20 further comprising the step of drying said semiconductor surface with nitrogen gas.

22. The method of claim 20 further comprising the step of rinsing said semiconductor surface with water.

23. The method of claim 22 further comprising the step of drying said semiconductor surface with nitrogen gas.

24. The method of claim 20 wherein said irradiating step is provided by a Hg/Xe arc lamp.

25. The method of claim 20, wherein said metal contamination comprises trace metal.

26. The method of claim 20, wherein said metal contamination comprises reacted metal.

* * * * *